(12) United States Patent
Radenne et al.

(10) Patent No.: US 8,739,402 B2
(45) Date of Patent: Jun. 3, 2014

(54) METHOD OF MANUFACTURE OF IC CONTACTLESS COMMUNICATION DEVICES

(75) Inventors: Jean Pierre Radenne, Paris (FR); Christophe Mathieu, Mantes la Jolie (FR); Laurent Berdalle, St Aquilin de Pacy (FR)

(73) Assignee: Microconnections SAS, Mantes la Jolie (FR)

( * ) Notice: Subject to any disclaimer, the term of this patent is extended or adjusted under 35 U.S.C. 154(b) by 14 days.

(21) Appl. No.: 12/998,916

(22) PCT Filed: Dec. 17, 2008

(86) PCT No.: PCT/IB2008/055682
§ 371 (c)(1),
(2), (4) Date: Aug. 30, 2011

(87) PCT Pub. No.: WO2010/070393
PCT Pub. Date: Jun. 24, 2010

(65) Prior Publication Data
US 2011/0302770 A1    Dec. 15, 2011

(51) Int. Cl.
*H01K 3/10* (2006.01)
(52) U.S. Cl.
USPC ................ 29/852; 29/830; 29/832; 29/840; 438/108

(58) Field of Classification Search
USPC ............ 29/825, 830, 832, 840, 852; 438/108
See application file for complete search history.

(56) References Cited

U.S. PATENT DOCUMENTS

| | | | | |
|---|---|---|---|---|
| 4,204,213 | A * | 5/1980 | Wheeler et al. | 343/706 |
| 6,307,751 | B1 * | 10/2001 | Bodony et al. | 361/749 |
| 7,452,748 | B1 * | 11/2008 | Craig et al. | 438/108 |
| 7,546,671 | B2 * | 6/2009 | Finn | 29/592.1 |
| 8,138,614 | B2 * | 3/2012 | Yamazaki et al. | 257/783 |
| 2006/0009251 | A1 * | 1/2006 | Noda et al. | 455/550.1 |
| 2007/0181875 | A1 * | 8/2007 | Yamazaki et al. | 257/40 |
| 2008/0072423 | A1 * | 3/2008 | Finn | 29/854 |
| 2008/0096366 | A1 * | 4/2008 | Aoki et al. | 438/455 |
| 2009/0229109 | A1 * | 9/2009 | Finn | 29/601 |

FOREIGN PATENT DOCUMENTS

| | | |
|---|---|---|
| EP | 1 770 601 A1 | 4/2007 |
| WO | WO 2006/128203 | 12/2006 |
| WO | WO 2007/006633 A1 | 1/2007 |
| WO | WO 2007/058108 A1 | 5/2007 |
| WO | WO 2007/068280 A1 | 6/2007 |

\* cited by examiner

*Primary Examiner* — Carl Arbes
(74) *Attorney, Agent, or Firm* — Harrington & Smith (57) ABSTRACT

A method of manufacture of an electrical bridge including the following steps: (a) providing a first flexible electrically insulating material, (b) laminating a pattern of a second electrically conductive material, on the first material, (c) separating a strap having a connection portion formed from the pattern of electrically conductive material.

12 Claims, 7 Drawing Sheets

METHOD OF MANUFACTURE OF IC CONTACTLESS COMMUNICATION DEVICES

FIELD OF THE INVENTION

The instant invention relates to methods of manufacture of IC contact-less communication devices.

BACKGROUND OF THE INVENTION

Contact-less communication devices have now become fairly common in our everyday life. Such devices notably include contact-less cards, which enable to identify its bearer by a simple swiping movement before a suitable reader, or tags, such as anti-theft tags, to name a few. Such contact-less devices comprise an IC chip, which holds information about the product or the card-bearer, and an antenna, connected to the chip, to transmit this information to the reader.

The antenna classically is a coil comprising many turns, and having two ends, which have to be connected to one another to make the antenna operable. So-called "straps" have been used to electrically connect these two ends, without short-circuiting the turns of the antenna located between the ends. An example can be found in WO 2007/068,280. This example is satisfactory in many respects.

However, one strives to provide alternative ways to manufacture IC contact-less communication devices.

SUMMARY OF THE INVENTION

To this aim, it is provided a method according to claim 1.

With these features, a manufacturing method is provided, in which the strap is obtained by lamination, which is a well-known and well-controlled process. Hence, reproducibility of the manufacturing as a whole is improved.

In some embodiments, one might also use one or more of the features as defined in the dependent claims.

BRIEF DESCRIPTION OF THE DRAWINGS

Other characteristics and advantages of the invention will readily appear from the following description of some of its embodiments, provided as a non-limitative example, and of the accompanying drawings.

On the drawings:

FIG. 9 is a view similar to that of FIG. 8 of a fourth embodiment of an IC-device.

On the different Figures, the same reference signs designate like or similar elements.

DETAILED DESCRIPTION

Figure 1:
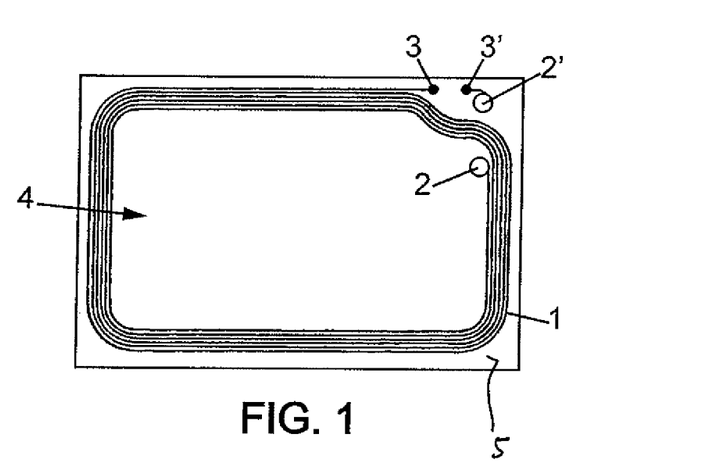
FIG. 1 is a schematic planar view of a card body according to a first embodiment.

FIG. 1 shows a card body 4 used for the manufacture of an IC contact-less communication device according to a first embodiment, here, an IC-card. The card body 4 can be manufactured conventionally, and its manufacture process will not be described in more details here. The card body 4 comprises a generally flexible card substrate 5 which carries or embeds an antenna 1 which can, for example, be shaped to the same size as the substrate. The antenna, performed as a coil having many turns, has two ends 2 and 2' separated by at least one of the turns. These two ends form two opposite connection portions. Further, the antenna 1 comprises two pads 3 and 3' adapted for the connection of an IC chip. For example, as shown, the two pads 3 and 3' are located close to one of the connection portions 2', although other embodiments are possible.

FIGS. 2a to 2d now show steps of the manufacturing of a strap for the card body 4 of FIG. 1. The strap is designed to connect together the ends 2 and 2' of the antenna, without short circuiting the intervening turns. As shown on FIG. 2a, an elongated band 6 of flexible, electrically insulating material is provided. The band 6 is for example unwound from an unshown unwinding station, and is made to progress along its longitudinal direction X in an apparatus in any conventional way. The direction in which the band is longest is called its longitudinal direction X, and the direction along which it is the shortest is called the thickness direction Z. The width is defined along the third direction Y. The band has two opposite faces 6a and 6b with respect to the thickness direction Z. On FIG. 2a, only a part of the band, which will provide two straps, is shown. The same part is shown until FIG. 2d.

Figure 2A:
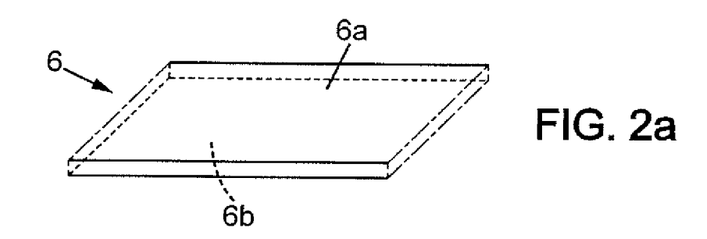
FIGS. 2a to 2d are schematic partial perspective views of manufacturing steps of a strap according to a first embodiment.
Figure 2B:
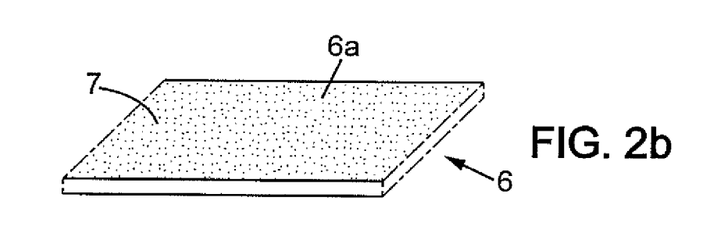

As shown on FIG. 2b, the band 6 progresses to a glue application station of the apparatus, where glue 7 is applied onto one of the main faces 6a of the band 6. Any suitable kind of glue can be applied.

Figure 2C:
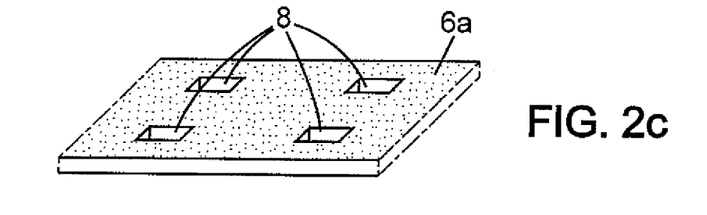

As shown on FIG. 2c, the band 6 then moves to a perforation station in which through holes 8 are performed in the band 6, for example following a periodic pattern along direction X and Y. The through holes 8 are performed along the thickness direction Z and extend throughout the band 6 from the first face 6a to the second face 6b. On FIG. 2c, which corresponds to two straps, four through holes 8 are performed. Thus, the upper part of FIG. 2c and the lower part of FIG. 2c will each correspond to a strap. Each future strap comprises a through hole 8 corresponding to the one on the left side of FIG. 2c and one corresponding to the one on the right side of FIG. 2c.

Figure 2D:
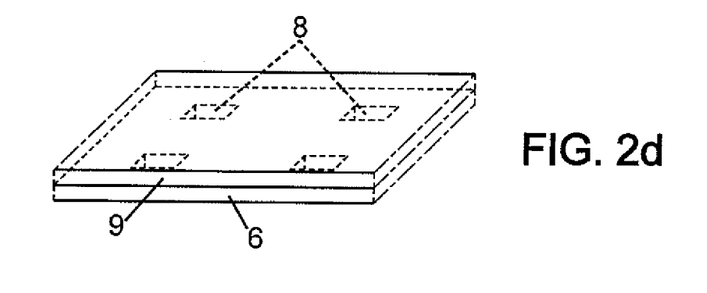

As now shown on FIG. 2d, a pattern of an electrically conductive material, such as copper, is laminated on the band 6, and in particular on a main face 6a of the band 6. The pattern is for example a continuous layer 9 of metal, which is continuous along a part of the band at least corresponding to one future strap, and, as shown, at least corresponding to two future straps. In the present example, where glue 7 is present on the main face 6a of the band, a metal foil 9 is glued on this surface.

Figure 2E:
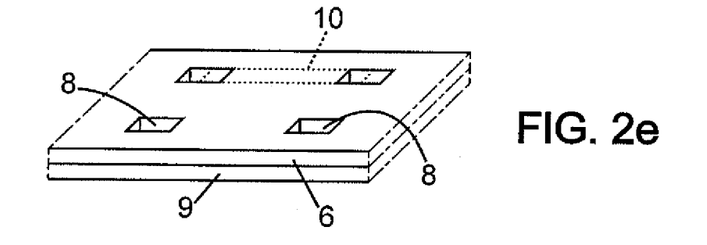
FIG. 2e is a schematic view of the product of FIG. 2d along another perspective.

As can be shown on FIG. 2d, the electrically conductive foil 9 completely covers the through holes 8 previously performed in the insulative material. FIG. 2e shows a reverse perspective view of a product of FIG. 2d.

Also shown on FIG. 2e, with dotted lines 10, a strap is separated from the product by cutting, or the like, along the lines 10. In particular, the separation line 10 passes through the through holes 8, in this embodiment.

Figure 3A:
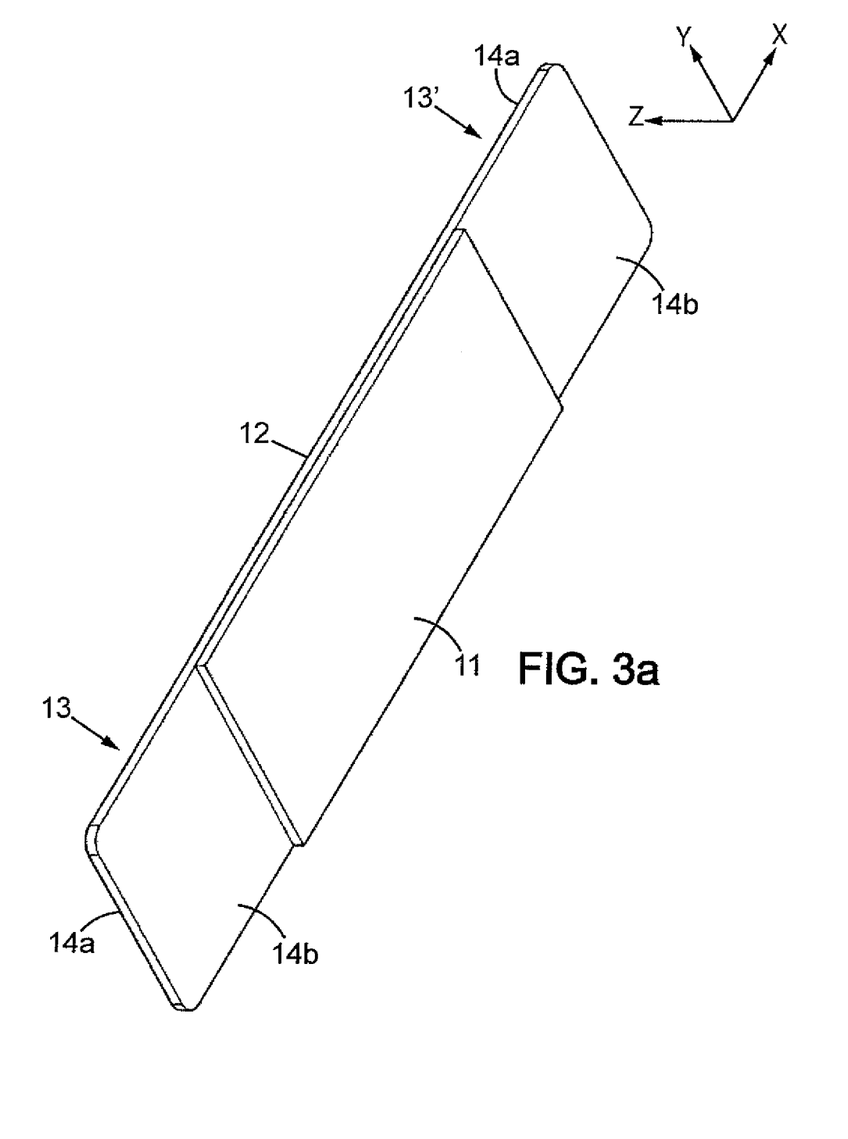
FIG. 3a is a perspective view of a strap manufactured according to the first embodiment.

The resulting strap can be shown on FIG. 3a. It comprises a layer 1 of the electrically isolating material, obtained from the band 6, and a second layer 12 of electrically conductive i.e. metallic material, obtained from the foil 9. Due to the location of the separation (the line 10) as shown on FIG. 2e, the second layer 12 is longer, along direction X, than the first layer 1 on each lateral side, since the separation line 10 passes through the hole 8. Thus, each lateral side of the second layer 12 defines a connection portion 13, 13' in which the second layer 12 extends, but not the first layer 1. Hence, in each connection portion 13, the second layer 12 has a first free face 14a and an opposite second free face 14b, opposite to one another with respect to the thickness direction Z.

Figure 3B:
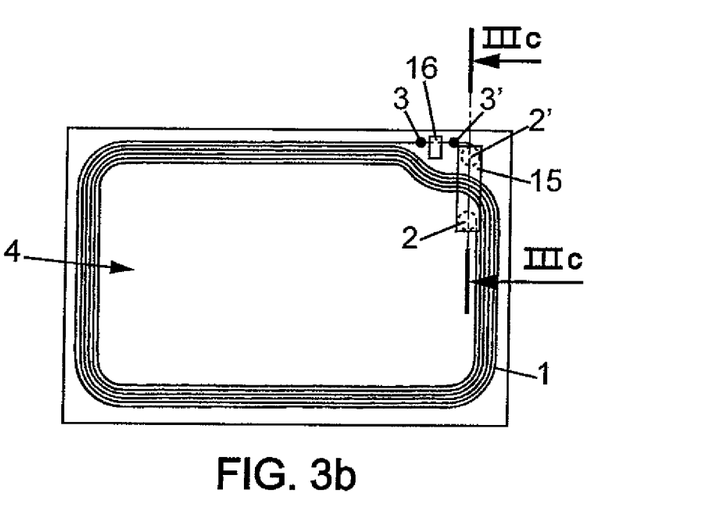
FIG. 3b is a schematic planar view of an IC-card according to a first embodiment.
Figure 3C:
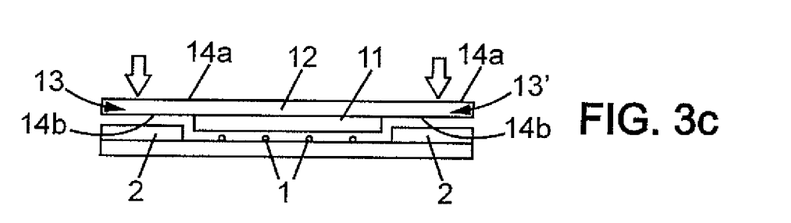
FIG. 3c is a partial sectional view of an IC-card along line IIIc-IIIc of FIG. 3b.

As shown on FIGS. 3b and 3c, the strap 15 as shown on FIG. 3a is placed onto the card body 4, with its first connection portion 13 facing the corresponding first connection portion 2 of the antenna 1, and its second connection portion 13' facing a second connection portion 2' of the antenna 1. The face 14b faces the respective connection portions 2, 2' and the strap is assembled thereto, for example by applying heat and/or ultrasonic energy on the first face 14a of the connection portions as shown by the arrows on FIG. 3c. The strap is oriented with its insulative layer 1 disposed in between the turns of the antenna 1 and the second layer 12 of electrically conductive material along the thickness direction Z, to prevent any short-circuit. In this way, an electrical connection is performed between the connection portion 2 of the card body and that 13 of the strap, as well as between the connection portions 2', 13'. In alternative, only one of these connections could be performed as disclosed above, the other connection being possibly performed by any other conventional method, when applicable.

Turning back to FIG. 3b, an IC chip 16 is mechanically fixed onto the card substrate 5 and is electrically connected between the pads 3 and 3' by any suitable means. The card will be able to communicate with a suitable reader at a frequency in the range of radio frequencies such as, for example, 13.56 MHz.

Figure 4:
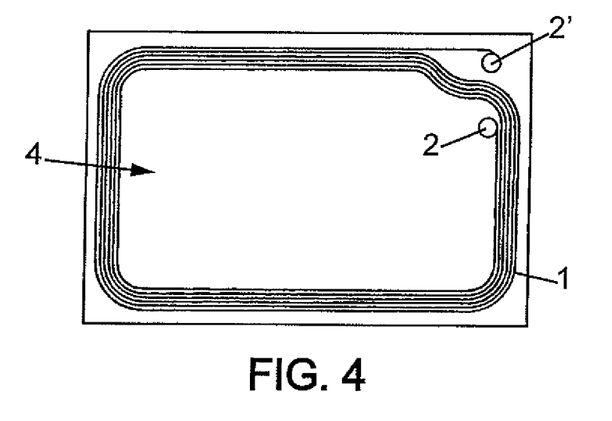
FIG. 4 is a schematic planar view of a card body according to a second embodiment.

A card body 4 according to a second embodiment is schematically shown on FIG. 4. In the following, we will describe the second embodiment with reference to the first embodiment, but not describe again features which are identical or similar to the first embodiment. The card body 4 of the second embodiment differs mainly from that of the first embodiment by the lacking of pads 3, 3' for the connection to an IC-chip. The IC-chip is carried by the strap itself.

Figure 2F:
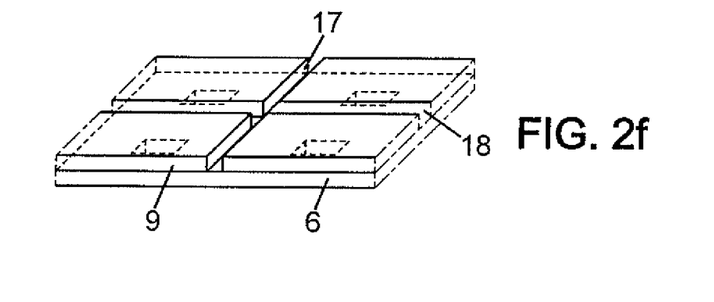
FIG. 2f is a schematic partial perspective view of a manufacturing step of a strap according to a second embodiment.

According to the second embodiment, the manufacture of a strap begins as described above in relation to FIGS. 2a to 2d. As shown on FIG. 2f, a pattern of electrically conductive material is formed which is different from the continuous pattern of the first embodiment. This pattern is performed by any suitable technique, such as for example, protecting part of the foil 9 with a suitable mask, and etching the non protected parts, so as to perform one or more grooves 17 in each future strap, where the groove does not contain any electrically conductive material. Two or more conductive portions of the pattern could thus be electrically insulated from one another. A groove 18 can also be performed between two neighbour straps, if desired. The masking material can then be removed, for example by chemical etching.

Figure 5A:
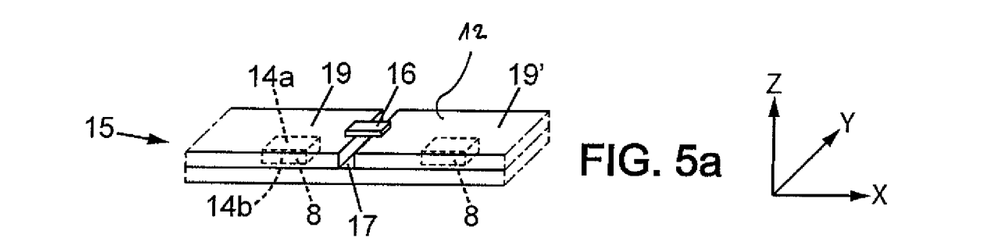
FIG. 5a is a perspective view of a strap manufactured according to the second embodiment.

A strap 15 according to a second embodiment is then separated from the band, as shown on FIG. 5a. As shown on this figure, separation is not performed along the same line as the first embodiment, i.e. does not pass through the through holes. The part of the first layer 1 which surrounds each hole 8 is a part of the strap. The strap thus comprises a first layer 1 of an electrically insulating material, and a second layer 12 of electrically conducting material, which is not longer (for example of the same length) than the first layer 11 along the X direction, and comprises a first band of metal 19 and a second band of metal 19' which are electrically insulated from one another by the groove 17, and each cover a respective through hole 8 of the first layer 11. Thus, the first band of metal 19 comprises, at the level of the through hole, a first free face 14a and an opposite second free face 14b opposed along the thickness direction Z. The same applies to the second band of metal 19'.

An IC chip 16 is mechanically fixed to the strap 15. For example, the chip 16 has two electrical connection portions on its bottom face (with the orientation of FIG. 5) which are brought in electrical communication each with a respective band 19, 19', while the chip is anchored on the strap (so called "flip-chip" connection). The chip 16 bridges over the groove 17, or in any case, the electrical connection portions of the chip are not short-circuited thanks to the groove 17. In a variant embodiment (not shown), the chip 16 could be mechanically anchored reversed with respect to the above description, and its electrical connections facing up on FIG. 5a. The chip is electrically connected to the bands 19, 19' by wire bonding, for example golden wire bonding. Encapsulation in resin is then performed.

Figure 5B:
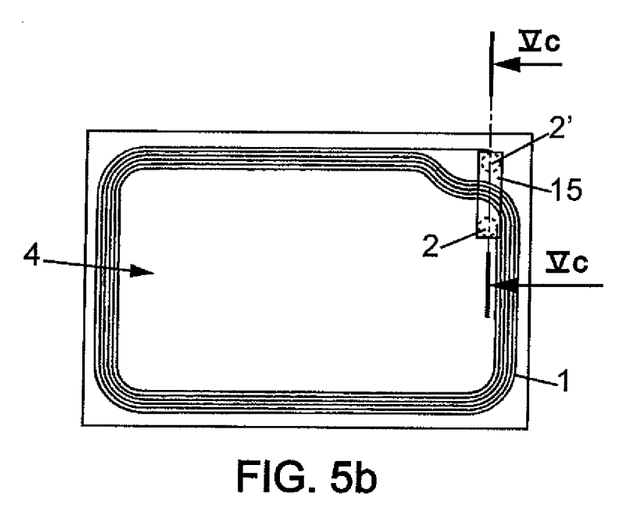
FIGS. 5b-5c are views similar to FIGS. 3b-3c, respectively for a second embodiment.
Figure 5C:
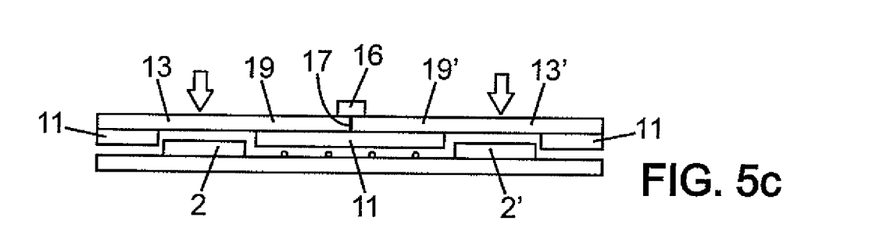

The resulting strap 15 is connected to the card body 4 as shown on FIGS. 5b and 5c. On FIG. 5c, the arrows still show where the welding energy is applied. The connection portions 13 and 13' are defined as parts of the electrically conductive layer 12 of the strap which overlie the holes 8 of the first insulating layer, and in which the connection portions 2 and 2' of the card body 4 are received.

According to a third embodiment, it will be understood that the card body 4 of FIG. 1 could be used with a strap 15, as shown on FIG. 5a, but without the IC chip 16 and the groove 17, i.e. with a continuous layer of electrically conductive material 12.

In yet another embodiment, the card substrate of FIG. 4 could receive a strap as shown on FIG. 3a, further comprising a groove 17 and an IC chip mounted directly on the strap as explained above with respect to the second embodiment.

In other embodiments, it will be understood that lamination is not necessarily performed by gluing, and that it is possible to laminate a metallic layer by cladding, in which case the holes will be performed after cladding in the layer of insulating material, for example by laser or the like.

It should be mentioned that, due to the above disclosed method, grooves 17, 18 of very small dimensions, for example of less than 100 μm width could be performed.

Figure 6A:
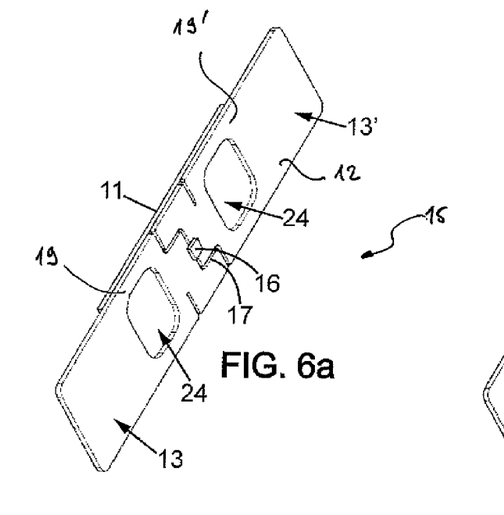
FIGS. 6a and 6b are two perspective views of variant embodiments of the strap of FIG. 5a, FIG. 7a is a view similar to FIG. 6a for a third embodiment of a strap.

According to a variant embodiment of FIG. 5a, which is shown on FIG. 6a, the groove 17 could be provided with a stepped shape. Further, recesses 24 could be performed in the bands of metal 19, 19', to improve the flexibility of the strap 15. These recesses 24 are performed outside the connection portions 13, 13'. The recesses 24 can take any appropriate shape, such as shown on FIG. 6a. For example, they are manufactured beforehand by through holes or blind holes in the foil 9 (FIG. 2d).

Figure 6B:
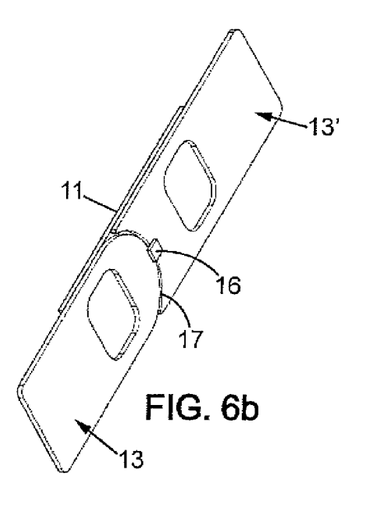
Figure 7A:
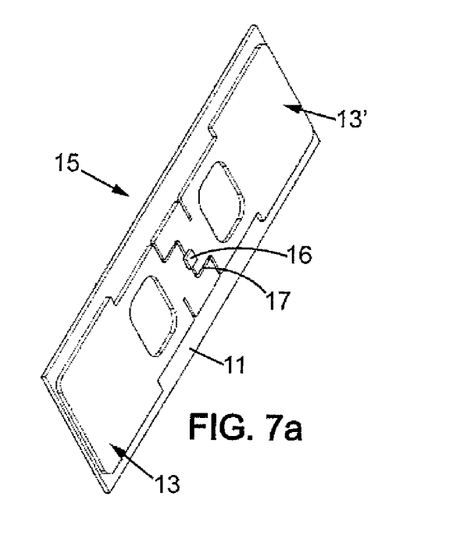
Figure 7B:
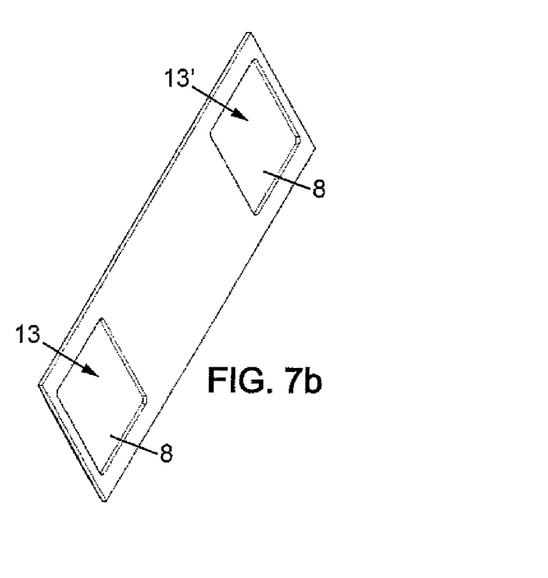
FIG. 7b is an opposite perspective view of the strap of FIG. 7a, FIG. 8 is a perspective view of a third embodiment of an IC-device.

According to yet another embodiment, as shown on FIG. 6b, the groove 17 could be performed with an accurate shape. Thus, many kinds of shapes are possible for the groove 17. FIG. 7a shows yet another embodiment of a strap 15 with a groove 17 with a stepped shape. As shown in particular on FIG. 7b, which is the reverse side of FIG. 7a, holes 8 enable to define the connection portion 13 and 13' of the strap.

Figures 8, 9:
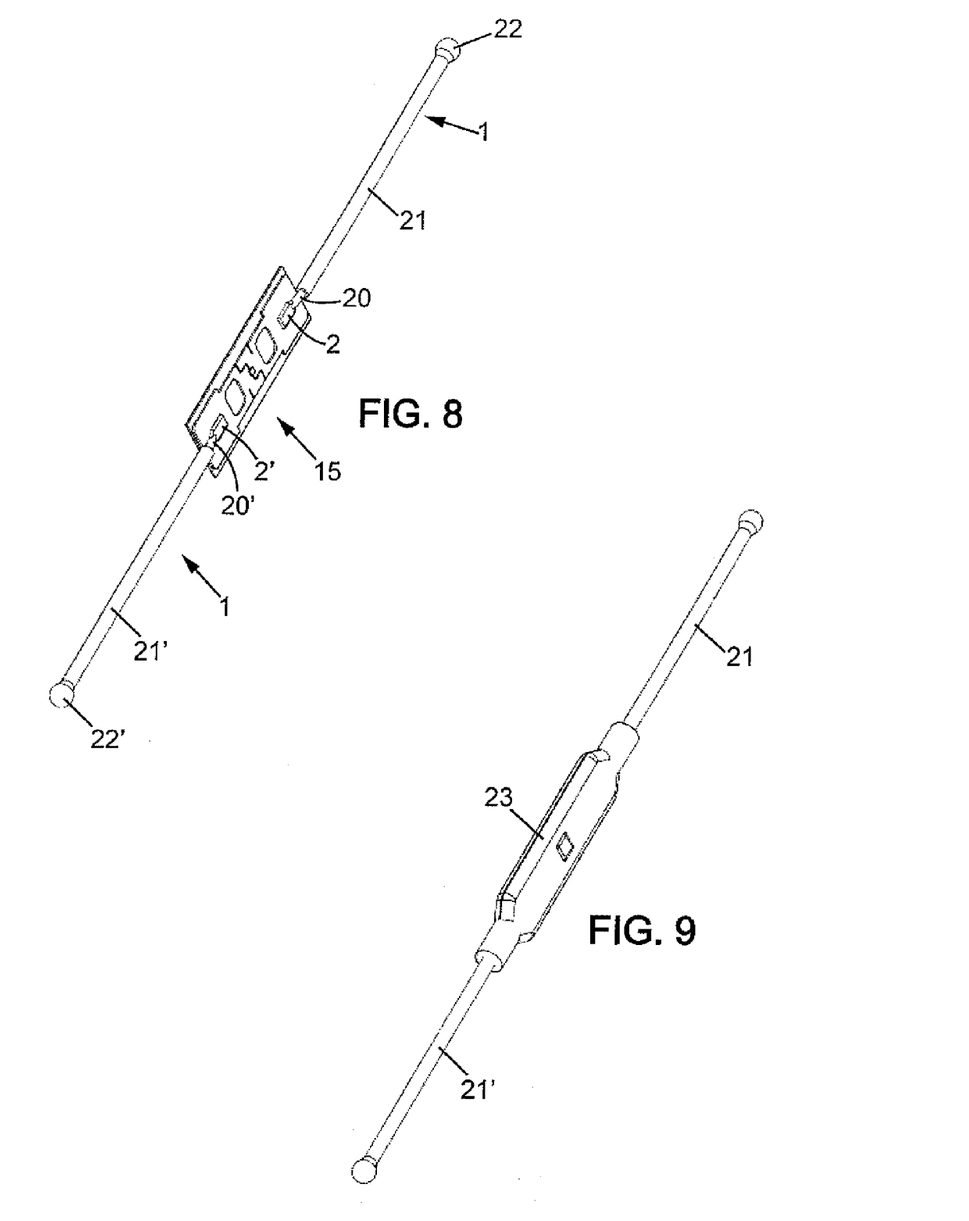

According to yet another embodiment, as shown on FIG. 8, the strap 15 is not necessarily integrated in an IC chip card. It will for example be welded, on both sides to an antenna 1 which comprises an electrical wire 20 terminating at a connection end 2, 2', and an insulating sheath 21. At its other end, away from the strap, the sheath 21 could be terminated by a rounded protective ball 22, 22'. As shown on FIG. 9, the strap 15 and the ends of the sheath 21, 21' close to it could then be encapsulated in a plastic housing 23 for protection. The device of FIG. 9 could for example be used as an IC tag, for example incorporated in towels or the like, and communicates with a suitable reader, in a range of ultra high frequencies (UHF), for example 860 MHz.

The invention claimed is:

1. A method for manufacturing an electrical bridge comprising the following steps:
   (a) providing an elongated band of a first flexible electrically insulating material,
   (b) laminating, in a plurality of locations of the band, a pattern of a second electrically conductive material, on the first electrically insulating material,
   (c) separating, from each location, a strap so that said strap comprises:
      a first layer of the first electrically insulating material,
      a second layer of the second electrically conductive material,
      at least a first connection portion formed from the second layer having a first free face made of the second electrically conductive material only, and a second free face made of the second electrically conductive material only opposite to the first free face regarding a thickness direction (Z_ of the strap, and
      at least a second connection portion,
      where a portion of the first layer of the first electrically insulating material extends between the first and second connection portions.

2. Method according to claim 1, wherein the second connection portion is formed from the second layer having a first free face and a second free face opposite to the first free face with respect to a thickness direction (Z) of the strap.

3. A method according to claim 1 wherein,
   at step (a), the band is provided with a through hole disposed along the thickness direction (Z) in each location,
   at step (b), the pattern at least partly covers the through hole, and
   at step (c), the strap is separated from the band.

4. A method according to claim 1, wherein at step (b), the laminated pattern is a band of metal comprising first and second portions which are to be the first and second connection portions of the strap.

5. A method according to claim 1, wherein at step (b), the laminated pattern comprises at least a first and a second bands of metal, electrically insulated from one another, and wherein each band of metal comprises a respective portion which is to become the respective first and second connection portions of the strap.

6. A method according to claim 1, wherein, at step (b), the pattern is laminated with a recess outside the connection portions.

7. A method according to claim 1, wherein, at step (b), the laminated pattern is a band of metal comprising first and second portions which will become the first and second portions of the strap.

8. A method for electrically connecting two connection portions of an antenna comprising the step of:
   (a) providing an elongated band of a first flexible electrically insulating material,
   (b) laminating, in a plurality of locations of the band, a pattern of a second electrically conductive material, on the first electrically insulating material,
   (c) separating, from each location, a strap so that said strap comprises:
      a first layer of the first electrically insulating material,
      a second layer of the second electrically conductive material,
      at least a first connection portion formed from the second layer having a first free face made of the second electrically conductive material only, and a second free face made of the second electrically conductive material only opposite to the first free face regarding a thickness direction (Z) of the strap, and
      at least a second connection portion,
      where a portion of the first layer of the first electrically insulating material extends between the first and second connection portions,
      (i) providing, in relation to each strap, an antenna having first and second distant connection portions,
      (ii) assembling the first free face of the first connection portion of the strap and the first connection portion of the respective antenna in an electrically conductive manner, and assembling the second connection portion of the strap and the second connection portion of the respective antenna in an electrically conductive manner.

9. A method according to claim 8, wherein, step (i) comprises providing, in relation to each strap, a card body comprising a card substrate carrying a coil having at least one turn, forming said antenna.

10. A method according to claim 9 wherein, at step (ii), the first layer is placed between the second layer and the card substrate.

11. A method according to claim 8, further comprising a step of electrically connecting an IC-chip to the antenna.

12. A method according to claim 11, wherein, at step (iii), the chip is mechanically directly attached to the strap, the chip having first and second electrical connection portions respectively electrically connected to the first and second band of metals.

* * * * *

UNITED STATES PATENT AND TRADEMARK OFFICE
CERTIFICATE OF CORRECTION

PATENT NO. : 8,739,402 B2
APPLICATION NO. : 12/998916
DATED : June 3, 2014
INVENTOR(S) : Radenne et al.

Page 1 of 1

It is certified that error appears in the above-identified patent and that said Letters Patent is hereby corrected as shown below:

In the Claims

Claim 1:
Column 5, line 42, "(Z_" should be deleted and --(Z)-- should be inserted.

Claim 11:
Column 6, line 53, "step of" should be deleted and --step (iii) of-- should be inserted.

Signed and Sealed this
Seventh Day of October, 2014

Michelle K. Lee
*Deputy Director of the United States Patent and Trademark Office*